United States Patent [19]

Rivoli

[11] Patent Number: 4,696,395
[45] Date of Patent: Sep. 29, 1987

[54] SUBSTRATE CONTAINER

[75] Inventor: Mark S. Rivoli, Torrance, Calif.

[73] Assignee: Northrop Corporation, Hawthorne, Calif.

[21] Appl. No.: 930,849

[22] Filed: Nov. 14, 1986

[51] Int. Cl.$^4$ .............................................. B65D 85/30
[52] U.S. Cl. .................................... 206/334; 206/449; 206/459
[58] Field of Search .................... 206/334, 449, 454

[56] References Cited

U.S. PATENT DOCUMENTS

| | | | |
|---|---|---|---|
| 2,919,021 | 12/1959 | Robinson et al. | 206/454 X |
| 3,014,594 | 12/1961 | Kerstner | 206/334 X |
| 4,490,087 | 12/1984 | Ryan et al. | 206/334 X |
| 4,506,785 | 3/1985 | Seefeldt | 206/334 |
| 4,574,950 | 3/1986 | Koe et al. | 206/334 |
| 4,588,086 | 5/1986 | Coe | 206/334 |

Primary Examiner—William Price
Attorney, Agent, or Firm—Terry J. Anderson

[57] ABSTRACT

A container for retaining, supporting and transporting a plurality of workpieces such as hybrid substrates in a vertical orientation. The container comprising a base, a slide and a cover. The base has a fixed, horizontally extending block with a fixed lateral support vertically upstanding from one of its faces. It also has a plurality of v-shaped notches formed therein facing toward the opposite face of the block. The slide has a horizontally extending plate adjustably positionable upon the upper surface of the horizontally extending block with an adjustable lateral retainer upstanding from one edge of the horizontally extending plate. It also has a plurality of v-shaped notches formed therein facing the v-shaped notches of the fixed lateral support. The base and slide are formned of an anti-static material. Nuts and bolts are provided to releasably secure the slide to the base in any one of a plurality of positions. Lastly, the cover is provided and is positionable over the base and slide to protect from contaminants the hybrid substrates supported by the block and slide.

21 Claims, 6 Drawing Figures

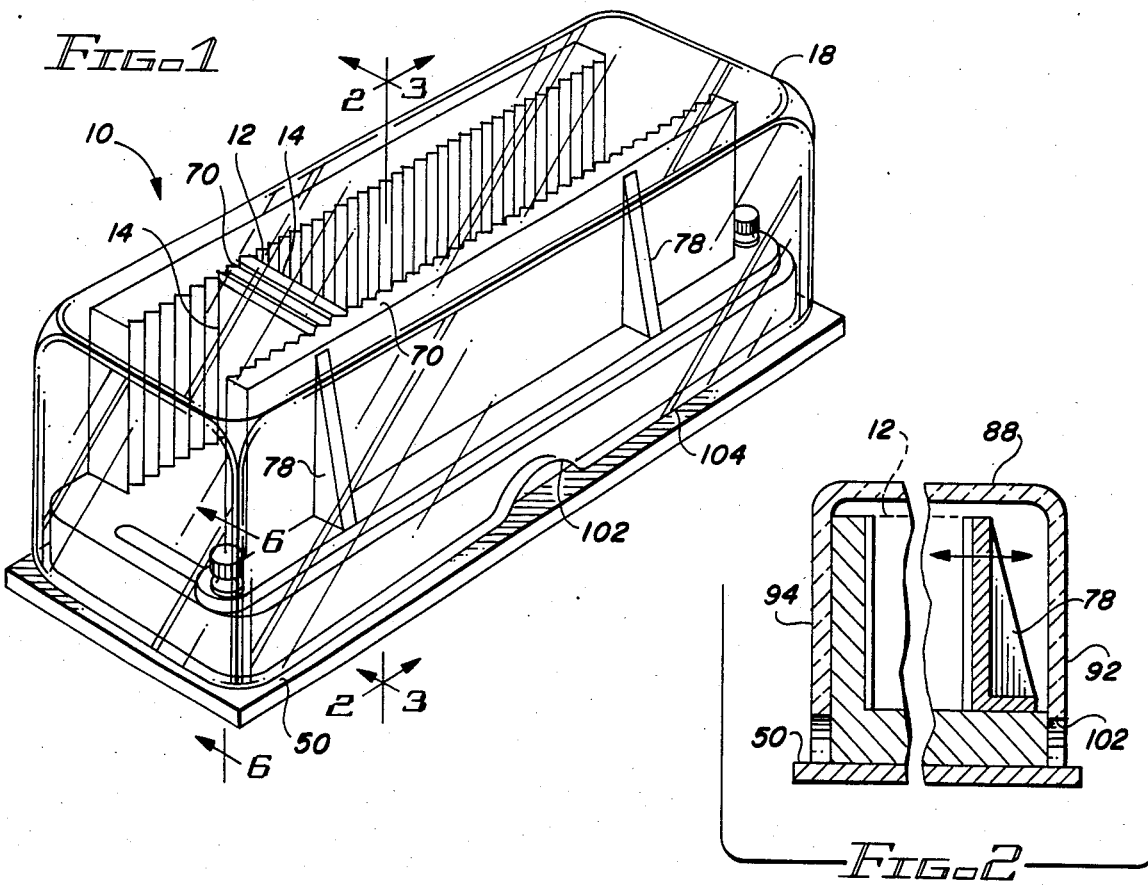
FIG.-1
FIG.-2
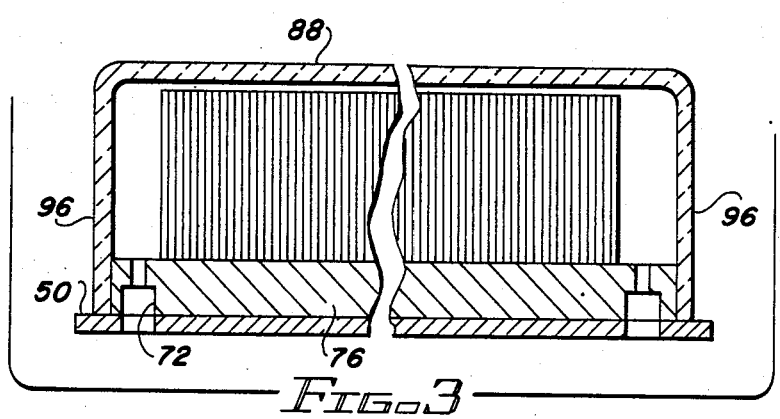
FIG.-3
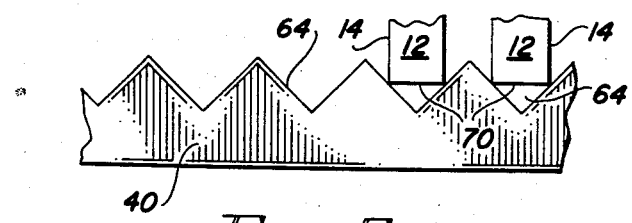
FIG.-5
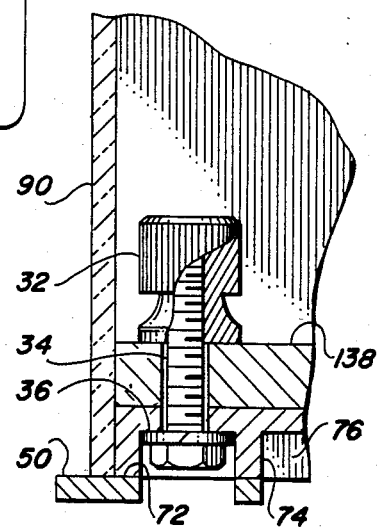
FIG.-6

SUBSTRATE CONTAINER

This invention was made with Government support under FO4704-75-C-0023 awarded by the U. S. Air Force.

SUMMARY OF THE INVENTION

This invention relates to apparatus for holding a plurality of workpieces and, more particularly, to a container for retaining, storing and transporting hybrid substates.

BACKGROUND OF THE INVENTION

Recent advances in the semiconductor art have resulted in high quality workpieces with complex miniaturized components and circuitry, such as large scale integrated circuits, small scale integrated circuits and hybrid integrated circuits. Because of the high costs to design and fabricate such hybrid substates, there is an ever-increasing need to protect such valuable products from damage as from mishandling, contaminants, static electricity, or the like. Such protection must extend from the completion of the fabrication process, to any testing and through transportation and storage. Without appropriate protective containers to preclude damage, the unit cost and price for such hybrid substrates would be unnecessarily increased.

Damage to hybrid substrates can be reduced and even eliminated by appropriate holders or containers designed and constructed specifically to such purpose. The prior art discloses a large number of holders or containers of various configurations generally suitable for supporting flat objects such as hybrid substrates. Some of such prior devices are even specifically designed for the same purpose of the present invention.

In U.S. Pat. No. 3,850,296 to Hirata et al, for example, a block-type holder is specifically configured for supporting flat, circular semiconductor wafers. The holder includes v-shaped grooves in angular orientations to receive the wafers at their lower edges only. Because of the angular orientation of the grooves, the holder can accept wafers larger or smaller than those shown in the patent. A disposable cover with expansible foam removably couples with the holder to protect the wafers from dust or damage from external sources.

U.S. Pat. No. 4,153,164 to Hofmeister also discloses a holder for semiconductor wafers. According to the Hofmeister disclosure, the waters are supported in horizontal, parallel planes by opposed, horizontal, parallel grooves. Support bars perpendicular to the v-shaped grooves allow for adjustment of the holder so that wafers of various sizes may be supported and held. No provision is shown for covering the holder and its contents.

In somewhat related art, holders are disclosed for supporting rectangular plates as of glass or the like. German Publication No. 2,234,949, for example, discloses an adjustable holder for supporting a plurality of rectangular workpieces in the form of glass panes. Several brackets with v-shaped receiving slots are shown, each movable into engagement with the edges of the workpieces to contact and retain the workpieces in a desired orientation. Straps are required to maintain the orientation of the brackets and workpieces. No removable cover is shown.

In U.S. Pat. No. 3,768,393 to Betz, workpieces such as photosensitive glass plates are supported in a vertical orientation by a two-piece container. Mating v-shaped grooves are formed in both the upper and lower parts of the container. No provision is made for adjustability.

As illustrated by a large number of prior patents and other disclosures, efforts are continuously being made in an attempt to safely, conveniently and economically retain, store and transport flat workpieces such as hybrid substrates. None of these disclosures, however, suggests the present inventive combination of elements for holding hybrid substrates as herein described and claimed. The present invention achieves its purposes, objects and advantages over the prior art through new, useful and unobvious components which increase user convenience, consistently insure maximum safety and, through the use of a minimum number of functioning parts, effect a reduction in cost. All this attained through the utilization of only readily available materials and conventional components.

These purposes, objects and advantages should be construed as merely illustrative of some of the more prominent features and applications of the present invention. Many other beneficial results can be attained by applying the disclosed invention in a different manner or by modifying the invention within the scope of the disclosure. Accordingly, other objects and advantages as well as a fuller understanding of the invention may be had by referring to the summary of the invention and detailed description describing the preferred embodiment of the invention in addition to the scope of the invention as defined by the claims taken in conjunction with the accompanying drawings.

SUMMARY OF THE INVENTION

The present invention is defined by the appended claims with the specific embodiment shown in the attached drawings. For the purposes of summarizing the invention, the invention may be incorporated into a container for retaining, supporting and transporting a plurality of hybrid substrates in a vertical orientation. The container comprises a base having a fixed, horizontally extending block with a fixed lateral support vertically upstanding from one face of the block and having a plurality of v-shaped notches formed therein facing toward the opposite face of the block. The container also comprises a slide having a horizontally extending plate adjustably positionable upon the upper surface of the horizontally extending block with an adjustable lateral retainer upstanding from one edge of the horizontally extending plate and having a plurality of v-shaped notches formed therein facing the v-shaped notches of the fixed lateral support. Attachment means are included to releasably secure the slide to the base in any one of a plurality of positions. Also included is a cover positionable over the base and slide to protect the hybrid substrates supported by the block and slide. The cover is formed with a top horizontal sheet and downwardly extending side sheets terminating in lower edges of a size and configuration to press fit over the faces of the block. The cover is of a size to encase the base and slide. The cover includes semi-circular cut out sections upwardly extending from the lower edges of the side sheets. The block is formed with slots adjacent its side faces and the plate is formed with apertures adjacent its ends. The slots and apertures are aligned to receive the attachment means for adjustably coupling the base and slide in a position to support hybrid substrates of a predetermined size. The attachment means includes a nut and a bolt extending through each aperture and slot.

The container may include one aperture for each slide end.

The invention may also be incorporated into a holder for supporting a plurality of flat rectangular workpieces in a vertical orientation. The holder comprises a base molded of a tough, rigid, wear resistant, anti-static polymeric material and having a fixed, horizontally extending block with a fixed lateral support vertically upstanding from one face thereof and having a plurality of v-shaped notches formed therein facing toward the opposite face of the block. The holder also comprises a slide molded of a tough rigid, wear resistant, anti-static polymeric material and having a horizontally extending plate adjustably positionable upon the upper surface of the horizontally extending block with an adjustable lateral retainer upstanding from one edge thereof and having a plurality of v-shaped notches formed therein facing the v-shaped notches of the fixed lateral support. Also included is attachment means to releasably secure the slide to the base in any one of a plurality of positions. The base and slide are preferably formed of Lemcen. The holder further includes a cover positionable over the base, slide and supported contents in frictional contact with the faces of the block. The cover is molded of a stiff, clear to translucent, durable polymeric material, preferably Lexan. The cover is formed with a top horizontal sheet and downwardly extending side sheets in a rectangular configuration with their opposite side sheets parallel with each other. The block is formed with vertically extending side faces in a rectangular configuration with their opposite side faces parallel with each other. The downwardly extending side sheets of the cover are press fit over the vertically extending faces of the block. Means are provided adjacent the lower edge of the block to effect the proper positioning of the cover with respect to the block.

Lastly, the invention may be incorporated into a container for supporting a plurality of hybrid substrates. The container includes a first member molded of a polymeric material with anti-static properties without the application of a surface coating. The first member is formed of a fixed, horizontally extending block and a fixed support upstanding therefrom with a plurality of substrate-supporting notches formed therein. The container also includes a second member molded of a polymeric material with anti-static properties without the application of a surface coating. The second member is formed of a horizontally extending plate adjustably positionable with respect to the horizontally extending block and an adjustable retainer upstanding therefrom with a plurality of substrate-supporting notches formed therein. Means are provided to releasably secure the second member to the first member in any one of a plurality of positions. In addition, the container includes a cover formed with downwardly extending side sheets adapted to be positioned over the first and second members and supported substrates. The material for the first and second members is Lemcen. The material for the cover is Lexan. The first member includes a circumferential lip extending outwardly from its lower edge to contact the cover and limit the movement of the cover onto the first member and to facilitate the removal of the cover from the first member. The uppermost edges of both the fixed support and the adjustable retainer extend upwardly to nearly contact the cover.

The foregoing has outlined rather broadly the more pertinent and important features of the present invention in order that the detailed description of the invention that follows may be better understood whereby the present contribution to the art can be more fully appreciated. Additional features of the invention will be described hereinafter which form the subject of the claims of the present invention. It should be appreciated by those skilled in the art that the conception and the specific embodiment disclosed herein may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

In the accompanying drawings:

FIG. 1 is a perspective view of a container constructed in accordance with the principles of the present invention, showing a plurality of hybrid substrates held in the container;

FIGS. 2 and 3 are sectional views of the container shown in FIG. 1 and taken along lines 2—2 and 3—3, respectively, of FIG. 1;

FIG. 5 is an enlarged plan view of the v-shaped notches taken at area 5 of FIG. 4; and FIG. 6 is a sectional view of a portion of the container taken along line 6—6 of FIG. 1;

DETAILED DESCRIPTION OF THE INVENTION

Figure 4:
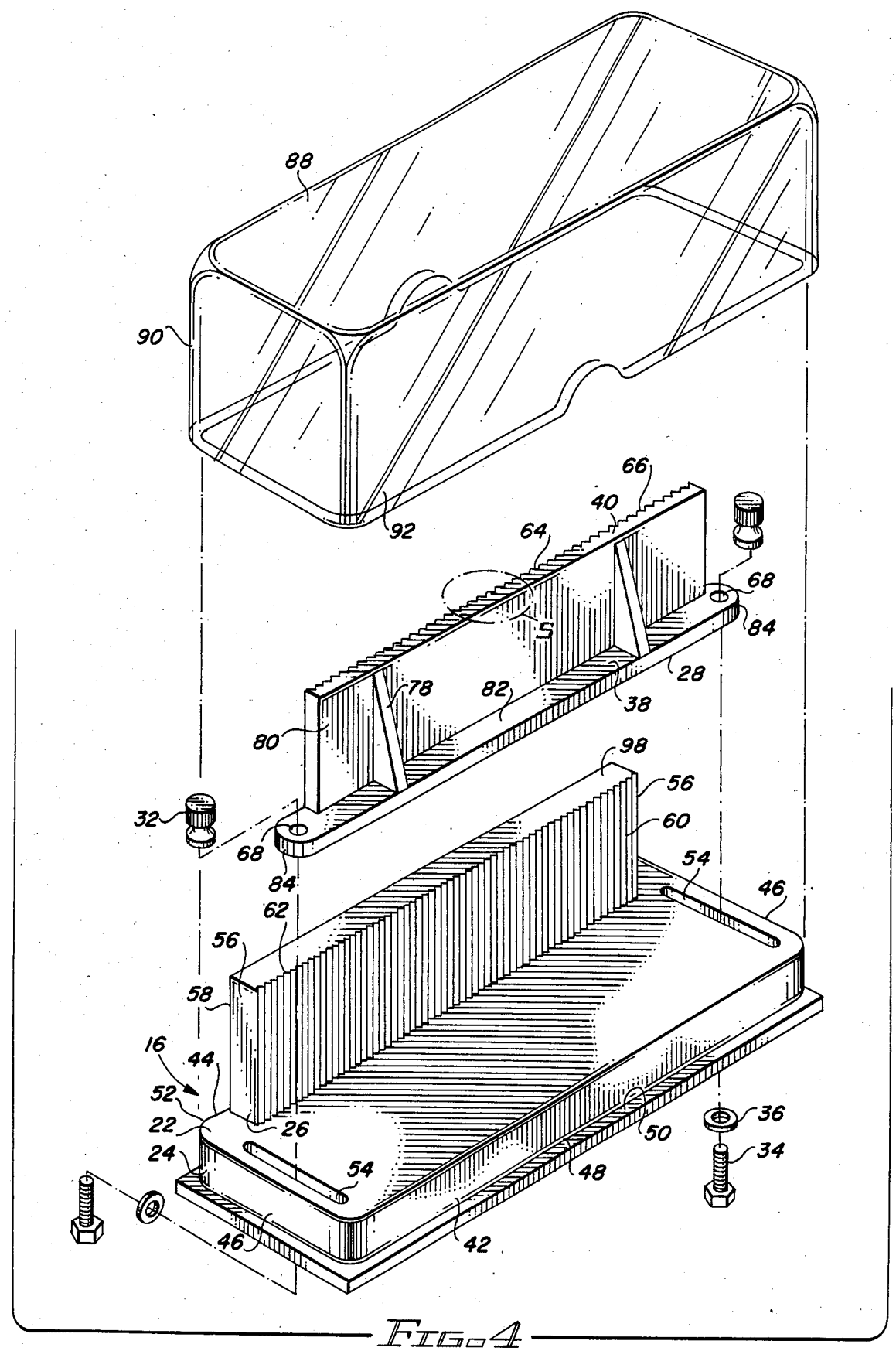
FIG. 4 is a perspective exploded view of the container shown in FIGS. 1, 2 and 3.

The apparatus or device of the present invention is a container 10 adapted for retaining, storing and transporting a plurality of workpieces such as hybrid substrates 12 or the like. The workpieces are relatively flat or planar with electronic components, circuitry, or the like on one or both sides 14. Because of the cost involved in the design and fabrication of such substrates, they must be kept safe from damage and contamination during fabrication, testing, transportation and storage.

According to the preferred embodiment, the container comprises a holder 16 and cover 18. The holder includes a base 22 formed of a block 24 and an integral lateral support 26. The holder also includes a slide 28 adjustably coupled to the block by knurled nuts 32 and bolts 34 positioned as a function of the size of the substrate to be supported. Washers 36 are also preferably utilized in the conventional manner. The slide 28 includes a plate 38 and an integral lateral retainer 40.

The holder 16 is formed of a fixed, horizontal block 24 having a front face 42 and a back face 44 coupled together by narrow side faces 46. The lower surface 48 of the block is adapted to be supported on a work table or other work area and is, therefore, formed of a planar configuration. The upper surface 52 is, likewise, of a planar configuration being adapted to support the lower edges of the workpieces 12. Slots 54 are formed in the block adjacent to, and parallel with, the side faces 46. The slots extend from adjacent the front face 42 to adjacent the integral lateral support 26.

The block 24 has formed on its lower edge a circumferencial lip or ledge 50 extending outwardly from the lower edge. It is of a size and position to contact the cover 18 when placed thereon and limit the movement of the cover onto the block. The lip 50 thus effects the proper positioning of the cover 18 with respect to the block 24. The lip 50 also constitutes an area for grasping the block when removing the cover from the block.

Integrally formed with the block is a vertical upstanding, fixed lateral support 26. The fixed lateral support has planar side faces 56 and a back face 58 extending a distance to be substantially coplanar with the back face 44 of the block 24 upon which it is formed. The front face 60 of the fixed lateral support 26 is formed with vertically extending v-shaped grooves 62 facing toward the front face 42 of the block 24. The grooves are equal in number to the maximum number of substrates 12 to be received and supported.

Adjustably secured with respect to the fixed horizontal block 24 is the slide 28. The slide includes an adjustable horizontal plate 38 and a vertically upstanding adjustable lateral retainer 40. The adjustable lateral retainer is formed with grooves 64 of a v-shaped configuration facing the back face 44 of the block as well as the grooves 62 of the fixed lateral support 26. The v-shaped grooves of the adjustable lateral retainer are formed on the front face 66 of retainer 40 and are equal in number, configuration and size to the grooves 62 of the fixed lateral support 26. As a result, when the grooves of the fixed lateral support and adjustable lateral retainer are operatively positioned facing each other, they will provide corresponding groove pairs for receiving opposed side edges 70 of the workpieces 12 to be supported.

The adjustable horizontal plate 38 of the slide 28 is of a length essentially equal to the length between the side faces 46 of the block 24. The plate 38 is provided with apertures 68 at its ends 84 spaced a distance equivalent to the distance between the slots 54 of the block. In this manner, the bolts 34, securable with knurled nuts 32, may be vertically extended through the apertures 68 and slots 54 to secure the slide 28 to the block 24 at any one of a plurality of positions to vary the space between opposed v-shaped notches and thereby receive workpieces 12 of a predetermined size. The block 24 has undercut areas 72 adjacent the slots 54 to accommodate the heads of the bolts 34. The remainder of the block has additional undercut areas 74 to reduce cost, but is provided with molded ribs 76 in a conventional manner to maximize strength. Additionally, triangular strengthening supports 78 have lower horizontal edges formed with the upper surface 82 of the plate 38. The triangular supports 78 also have upstanding vertical edges formed with, and extending a significant distance up, the adjacent vertical surface of the adjustable retainer 40.

With the slide fixedly positioned on the block, and with the opposing v-shaped grooves spaced equal to the width of the workpieces to be supported, the substrates may be positioned between opposing grooves for being supported on the upper surface of the block, the individual substrates being supported between corresponding groove pairs. The maximum number of workpieces to be received corresponds to the number of opposing groove pairs in the fixed lateral support and adjustable lateral retainer.

Structurally, the cover 18 includes a horizontal top sheet 88 with downwardly depending vertical sheets 90 molded as a rectangular box-like unit. The vertical sheets 90 include a front sheet 92 and a back sheet 94 and adjoining side sheets 96. The height of the vertical sheets is such as to extend from the lower surface 48 of the block to above the upper edge 98 of the fixed lateral support 26, adjustable lateral retainer 40, and the contained workpieces 12. The size of the top horizontal sheet 88 is substantially equal to the upper end lower surfaces of the block so that the cover 18 may be removably secured with a light friction fit onto the block out of contact with the workpieces. The lower portions of the vertical sheets of the cover are thus press fit in holding contact with the vertical faces of the block. The contacting surfaces of the block and vertical sheets are parallel to effect this coupling.

The topmost edge of the fixed support 26 and the topmost edge of the adjustable retainer 40 coextensively extend upwardly to nearly, or essentially, contact the top sheet 88 of the cover 18. The substrates 12, with their side edges 70 supported by the fixed support 26 and the adjustable retainer 40, extend upwardly to, or essentially to, the topmost edges of the support 26 and the retainer 40. This relationship between the substrates 12 and the components of the container 10 is designed for safety reasons in the event that the container 10 should be improperly bumped, moved, turned, inverted, or otherwise mishandled while supporting substrates 12. Under such mishandling, the substrates 12 will slide a minimum distance to thereby preclude damage to the electrical components on the substrates 12.

In order to facilitate removal of the cover from the base, semicircular cutouts 102 are provided centrally positioned along the lower edge 104 of the vertical front and back sheets 92 and 94 of the cover. The cutouts 102 and the lip 50 constitute areas for an operator to grasp the base with one hand so that the other hand may grasp the cover to effect the separation of the cover from the base when desired. With the cover in place on the block and with workpieces being supported by the block, such workpieces will be, and remain, free from dust or other contamination to preclude damage to the hybrid substrates.

The base and slide are preferably fabricated of a moldable thermoplastic polymer which is tough, rigid and wear-resistant and antistatic. A material such as that sold under the trade name Lemcen TM is preferred. Lemcen is a trademark of Gary Plastics Packaging Corporation of Bronx, New York. Other suitable tought, rigid, wear-resistant, antistatic materials could be utilized. The antistatic properties of these components, the only components which contact the workpiece, are of particular importance when the workpiece is a hybrid substrate with integrated circuitry thereon. The property is of much greater importance if the integrated circuitry is hybrid integrated circuitry which is particularly susceptible to being damaged if subjected to a discharge of static electricity. The use of Lemcen or equivalent antistatic material for contacting and supporting such type of substrate precludes damage to such workpiece which might otherwise be caused through a change buildup and static discharge through the components of the container contacting the workpiece. Without an anti-static material contacting the hybrid substrates, such static charge buildup may even occur incidentally through the inadvertent contact and rubbing of a person's apparel against the container.

The cover is preferably fabricated of a moldable thermoplastic polymer which is stiff, clear to translucent, and durable. A material such as Lexan TM is preferred. Lexan is a trademark of General Electric Co., Plastics Operations, Lexan Products Division, Pittsfield, Mass. for a polycarbonate resin. Other suitable stiff, clear to translucent, durable materials could be utilized. The use of Lexan or equivalent material with similar properties, taken in conjunction with the rectangular parallel surfaces of the container, allows for the stacking of containers, side by side, front to back, and above and beneath each other without damage to the containers or their contents.

In operation and use, the base is placed on a supporting surface. The slide is positioned with its v-shaped notches a predetermined distance from the v-shaped notches of the fixed lateral support so as to receive the edges of the plurality of hybrid substrates to be retained, supported and transported thereby. In such an orientation, the hybrid substrates may be vertically slid between opposing v-shaped notches whereby the lower edges of the substrates are supported on the upper surface of the block. The upstanding edges of the substrates are contacted and supported by the flat faces of the v-shaped notches to securely hold the substrates in position with their opposite sides free from potentially damaging contact with adjacent substrates and any other object. Note is taken that the flat surfaces of the v-shaped notches are in contact with the lines between the opposite sides of the substrates and their adjacent edges.

In the alternative, the opposed v-shaped notches may be initially spaced from each other slightly greater than the final preferred distance. After the substrates are placed in position, the bolts securing the slide to the block may be loosened and the slide moved toward the fixed lateral support a distance sufficient so that the substrates are securely held in the opposed notches. The arrow in FIGS. 2 illustrate the proper direction of motion of the slide. Thereafter the bolts may be retightened for a secure positioning of the v-shaped notches with respect to each other and a firm holding of the substrates within the container.

Finally, the cover is placed over the base, slide and supported substrates and slidingly positioned with a light friction fit with the lower free edges of the cover extending over the front, back and side faces of the block. The cutout sections of the cover, in association with the lip, allow the block to be grasped by an operator's fingers while the cover is grasped and lifted from the base in order to expose the substrates for removal from the container and subsequent use.

While the present invention has been described in its preferred embodiment, it is not intended to be so limited, but it is intended to be protected broadly within the spirit and scope of the appended claims.

What is claimed is:

1. A container for retaining, supporting and transporting a plurality of hybrid substrates in a vertical orientation comprising:

a base having a fixed, horizontally extending block with a fixed lateral support vertically upstanding from one face of the block and having a plurality of v-shaped notches formed therein facing toward the opposite face of the block;

a slide having a horizontally extending plate adjustably positionable upon the upper surface of the horizontally extending block with an adjustable lateral retainer upstanding from one edge of the horizontally extending plate and having a plurality of v-shaped notches formed therein facing the v-shaped notches of the fixed lateral support;

attachment means to releasably secure the slide to the base in any one of a plurality of positions; and a cover positionable over the base and slide to protect the hybrid substrates supported by the block and slide.

2. The container as set forth in claim 1 wherein the cover is formed with a top horizontal sheet and downwardly extending side sheets terminating in lower edges of a size and configuration to press fit over the faces of the block.

3. The container as set forth in claim 2 wherein the cover is of a size to encase the base and slide.

4. The container as set forth in claim 3 wherein the cover includes semi-circular cut out sections upwardly extending from the lower edges of the side sheets.

5. The container as set forth in claim 1 wherein the block is formed with slots adjacent its side faces and the plate is formed with apertures adjacent its ends with the slots and apertures being aligned to receive the attachment means for adjustable coupling the base and slide in a position to support hybrid substrates of a predetermined size.

6. The container as set forth in claim 5 wherein the attachment means includes a nut and a bolt extending through each aperture and slot.

7. The container as set forth in claim 6 wherein there is one aperture for each slide end.

8. A holder for supporting a plurality of flat rectangular workpieces in a vertical orientation comprising:

a base molded of a tough, rigid, wear resistant antistatic polymer material and having a fixed, horizontally extending block with a fixed lateral support vertically upstanding from one face thereof and having a plurality of v-shaped notches formed therein facing toward the opposite face of the block;

a slide molded of a tough, rigid, wear resistant, antistatic polymeric material and having a horizontally extending plate adjustably positionable upon the upper surface of the horizontally extending block with an adjustable lateral retainer upstanding from one edge thereof and having a plurality of v-shaped notches formed therein facing the v-shaped notches of the fixed lateral support; and attachment means to releasably secure the slide to the base in any one of a plurality of positions.

9. The holder as set forth in claim 8 wherein the base and slide are formed of Lemcen.

10. The holder as set forth in claim 8 and further including a cover positionable over the base, slide and supported contents in frictional contact with the faces of the block.

11. The holder as set forth in claim 10 wherein the cover is molded of a stiff, transparent or translucent, durable polymeric material.

12. The holder as set forth in claim 11 wherein the cover is molded of Lexan.

13. The holder as set forth in claim 10 wherein the cover is formed with a top horizontal sheet and downwardly extending side sheets in a rectangular configuration with their opposite side sheets parallel with each other.

14. The holder as set forth in claim 13 wherein the block is formed with vertically extending side faces in a rectangular configuration with their opposite side faces parallel with each other.

15. The holder as set forth in claim 14 wherein the downwardly extending side sheets of the cover are press fit over the vertically extending faces of the block.

16. The holder as set forth in claim 15 and further including means adjacent the lower edge of the block to effect the proper positioning of the cover with respect to the block.

17. A container for supporting a plurality of substrates including:
   a first member molded of a polymeric material with anti-static properties without the application of a surface coating and formed of a fixed, horizontally extending block and a fixed support upstanding therefrom with a plurality of substrate-supporting notches formed therein;
   a second member molded of a polymeric material with anti-static properties without the application of a surface coating and formed of a horizontally extending plate adjustably positionable with respect to the horizontally extending block and an adjustable retainer upstanding therefrom with a plurality of substrate-supporting notches formed therein;
   means to releasably secure the second member to the first member in any one of a plurality of positions; and
   a cover formed with downwardly extending side sheets adapted to be positioned over the first and second members and supported substrates.

18. The container as set forth in claim 17 wherein the material for the first and second members is Lemcen.

19. The container as set forth in claim 17 wherein the material for the cover is Lexan.

20. The container as set forth in claim 17 wherein the first member includes a circumferential lip extending outwardly from its lower edge to contact the cover and limit the movement of the cover onto the first member to thereby facilitate the removal of the cover from the first member.

21. The container as set forth in claim 17 wherein the uppermost edges of both the fixed support and the adjustable retainer extend upwardly to essentially contact the cover.

* * * * *